United States Patent
Kasher et al.

(10) Patent No.: US 10,225,828 B2
(45) Date of Patent: Mar. 5, 2019

(54) APPARATUS, SYSTEM AND METHOD OF COMMUNICATING CONTROL INFORMATION IN A PHYSICAL LAYER PROTOCOL DATA UNIT (PPDU)

(71) Applicant: INTEL IP CORPORATION, Santa Clara, CA (US)

(72) Inventors: Assaf Kasher, Haifa (IL); Carlos Cordeiro, Portland, OR (US); Solomon B. Trainin, Haifa (IL)

(73) Assignee: INTEL IP CORPORATION, Santa Clara, CA (US)

( * ) Notice: Subject to any disclaimer, the term of this patent is extended or adjusted under 35 U.S.C. 154(b) by 265 days.

(21) Appl. No.: 15/086,113

(22) Filed: Mar. 31, 2016

(65) Prior Publication Data

US 2017/0127386 A1     May 4, 2017

Related U.S. Application Data

(60) Provisional application No. 62/249,424, filed on Nov. 2, 2015.

(51) Int. Cl.
*H04W 72/04* (2009.01)
*H04B 7/0413* (2017.01)
*H04L 29/06* (2006.01)

(52) U.S. Cl.
CPC ........ *H04W 72/042* (2013.01); *H04B 7/0413* (2013.01); *H04L 69/22* (2013.01); *H04W 72/0453* (2013.01)

(58) Field of Classification Search
None
See application file for complete search history.

(56) References Cited

U.S. PATENT DOCUMENTS

2006/0126545 A1   6/2006   Nanda
2008/0285513 A1   11/2008   Jung et al.
(Continued)

FOREIGN PATENT DOCUMENTS

WO     2014151951     9/2014

OTHER PUBLICATIONS

IEEE Std 802.11™—2012. IEEE Standard for Information technology—Telecommunications and information exchange between systems Local and metropolitan area networks—Specific requirements Part 11: Wireless LAN Medium Access Control (MAC) and Physical Layer (PHY) Specifications, Mar. 29, 2012, 2793 pages.
(Continued)

*Primary Examiner* — Mohammad S Adhami
*Assistant Examiner* — Vladislav Y Agureyev
(74) *Attorney, Agent, or Firm* — Shichrur & Co.

(57) ABSTRACT

Some demonstrative embodiments include apparatuses, devices, systems and methods of communicating control information in a Physical Layer Convergence Protocol (PLCP) Protocol Data Unit (PPDU). For example, an apparatus may include logic and circuitry configured to cause a wireless station to generate a PPDU comprising a header field, a payload after the header field, and a control trailer after the payload, the control trailer comprising control information, the header field indicating presence of the control trailer; and to transmit the PPDU over a directional wireless communication band.

29 Claims, 5 Drawing Sheets

(56) References Cited

U.S. PATENT DOCUMENTS

| | | | | |
|---|---|---|---|---|
| 2011/0205444 A1* | 8/2011 | Yamamoto | ............. | H04N 7/163 348/726 |
| 2012/0044900 A1* | 2/2012 | Morioka | ............. | H04B 7/0617 370/329 |
| 2013/0269430 A1* | 10/2013 | Mauduit | ............... | G01F 23/284 73/290 V |
| 2013/0294347 A1* | 11/2013 | Das | ....................... | H04L 1/0088 370/328 |
| 2014/0079016 A1* | 3/2014 | Dai | ....................... | H04L 5/0041 370/330 |
| 2014/0126450 A1 | 5/2014 | Kim et al. | | |
| 2016/0249332 A1* | 8/2016 | Xin | .................... | H04L 27/3455 |
| 2017/0048844 A1* | 2/2017 | Chen | ................. | H04W 72/0413 |

OTHER PUBLICATIONS

IEEE Std 802.11ad™—2012. IEEE Standard for Information technology—Telecommunications and information exchange between systems Local and metropolitan area networks—Specific requirements Part 11: Wireless LAN Medium Access Control (MAC) and Physical Layer (PHY) Specifications Amendment 3: Enhancements for Very High Throughput in the 60 GHz Band, Dec. 28, 2012, 628 pages.
International Search Report and Written Opinion for PCT/US2016/059875, dated Feb. 2, 2017, 15 pages.
International Preliminary Report on Patentability for PCT/US2016/059875, dated Aug. 1, 2017, 13 pages.

\* cited by examiner

APPARATUS, SYSTEM AND METHOD OF COMMUNICATING CONTROL INFORMATION IN A PHYSICAL LAYER PROTOCOL DATA UNIT (PPDU)

CROSS REFERENCE

This Application claims the benefit of and priority from U.S. Provisional Patent Application No. 62/249,424 entitled "APPARATUS, SYSTEM AND METHOD OF COMMUNICATING CONTROL INFORMATION IN A PHYSICAL LAYER CONVERGENCE PROTOCOL (PLCP) PROTOCOL DATA UNIT (PPDU)", filed Nov. 2, 2015, the entire disclosure of which is incorporated herein by reference.

TECHNICAL FIELD

Embodiments described herein generally relate to communicating control information in a Physical Layer Convergence Protocol (PLCP) Protocol Data Unit (PPDU).

BACKGROUND

A wireless communication network in a millimeter-wave band may provide high-speed data access for users of wireless communication devices.

According to some Specifications and/or Protocols, devices may be configured to perform all transmissions and receptions over a single channel bandwidth (BW).

Some Specifications may be configured to support a Single User (SU) system, in which a Station (STA) cannot transmit frames to more than a single STA at a time.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
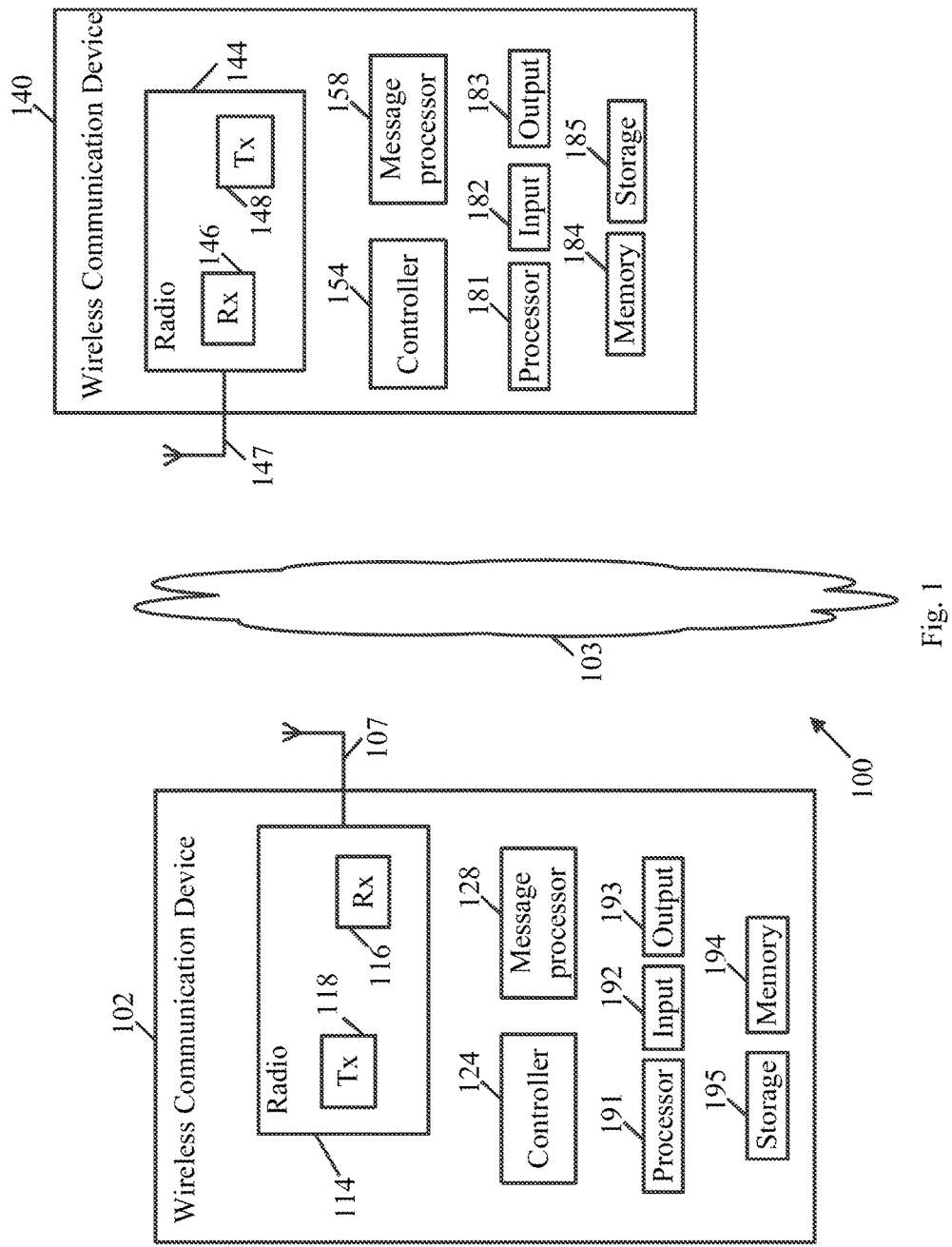
FIG. 1 is a schematic block diagram illustration of a system, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, a User Equipment (UE), a Mobile Device (MD), a wireless station (STA), a Personal Computer (PC), a sensor device, an Internet of Things (IoT) device, a desktop computer, a mobile computer, a laptop computer, a notebook computer, a tablet computer, a server computer, a handheld computer, a handheld device, a wearable device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some embodiments may be used in conjunction with devices and/or networks operating in accordance with existing Wireless-Gigabit-Alliance (WAG) specifications (including *Wireless Gigabit Alliance, Inc WiGig MAC and PHY Specification* Version 1.1, April 2011, *Final specification*) and/or future versions and/or derivatives thereof, devices and/or networks operating in accordance with existing IEEE 802.11 standards (IEEE 802.11-2012, *IEEE Standard for Information technology—Telecommunications and information exchange between systems Local and metropolitan area networks—Specific requirements Part* 11: *Wireless LAN*

Medium Access Control (*MAC*) and Physical Layer (*PHY*) *Specifications*, Mar. 29, 2012; IEEE802.11ac-2013 ("*IEEE P802.11ac-2013, IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications—Amendment 4: Enhancements for Very High Throughput for Operation in Bands below 6 GHz*", December, 2013); IEEE 802.11ad ("*IEEE P802.11ad-2012, IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications—Amendment 3: Enhancements for Very High Throughput in the 60 GHz Band*", 28 Dec. 2012); IEEE-802.11REVmc ("*IEEE 802.11-REVmc™/D6.0, June 2016 draft standard for Information technology—Telecommunications and information exchange between systems Local and metropolitan area networks Specific requirements; Part 11: Wireless LAN Medium Access Control (MAC) and Physical Layer (PHY) Specification*"); IEEE802.11-ay (*P802.11ay Standard for Information Technology—Telecommunications and Information Exchange Between Systems Local and Metropolitan Area Networks—Specific Requirements Part 11: Wireless LAN Medium Access Control (MAC) and Physical Layer (PHY) Specifications—Amendment—Enhanced Throughput for Operation in License-Exempt Bands Above 45 GHz*)) and/or future versions and/or derivatives thereof, devices and/or networks operating in accordance with existing WiFi Alliance (WFA) Peer-to-Peer (P2P) specifications (including *WiFi P2P technical specification*, version 1.5, Aug. 4, 2014) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Orthogonal Frequency-Division Multiple Access (OFDMA), FDM Time-Division Multiplexing (TDM), Time-Division Multiple Access (TDMA), Multi-User MIMO (MU-MIMO), Spatial Division Multiple Access (SDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G), or Sixth Generation (6G) mobile networks, 3GPP, Long Term Evolution (LTE), LTE advanced, Enhanced Data rates for GSM Evolution (EDGE), or the like. Other embodiments may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device.

As used herein, the term "circuitry" may refer to, be part of, or include, an Application Specific Integrated Circuit (ASIC), an integrated circuit, an electronic circuit, a processor (shared, shared, dedicated,) dedicated, or group), and/or memory or group), that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g. radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and the like. Logic may be executed by one or more processors using memory, e.g., registers, stuck, buffers, and/or the like, coupled to the one or more processors, e.g., as necessary to execute the logic.

Some demonstrative embodiments may be used in conjunction with a WLAN, e.g., a WiFi network. Other embodiments may be used in conjunction with any other suitable wireless communication network, for example, a wireless area network, a "piconet", a WPAN, a WVAN and the like.

Some demonstrative embodiments may be used in conjunction with a wireless communication network communicating over a frequency band of 60 GHz. However, other embodiments may be implemented utilizing any other suitable wireless communication frequency bands, for example, an Extremely High Frequency (EHF) band (the millimeter wave (mmWave) frequency band), e.g., a frequency band within the frequency band of between 20 Ghz and 300 GHZ, a frequency band above 45 GHZ, a frequency band below 20 GHZ, e.g., a Sub 1 GHZ (S1G) band, a 2.4 GHz band, a 5 GHZ band, a WLAN frequency band, a WPAN frequency band, a frequency band according to the WGA specification, and the like.

The term "antenna", as used herein, may include any suitable configuration, structure and/or arrangement of one or more antenna elements, components, units, assemblies and/or arrays. In some embodiments, the antenna may implement transmit and receive functionalities using separate transmit and receive antenna elements. In some embodiments, the antenna may implement transmit and receive functionalities using common and/or integrated transmit/receive elements. The antenna may include, for example, a phased array antenna, a single element antenna, a set of switched beam antennas, and/or the like.

The phrases "directional multi-gigabit (DMG)" and "directional band" (DBand), as used herein, may relate to a frequency band wherein the Channel starting frequency is above 45 GHz. In one example, DMG communications may involve one or more directional links to communicate at a rate of multiple gigabits per second, for example, at least 1 Gigabit per second, e.g., 7 Gigabit per second, or any other rate.

Some demonstrative embodiments may be implemented by a DMG STA (also referred to as a "mmWave STA (mSTA)"), which may include for example, a STA having a radio transmitter, which is capable of operating on a channel that is within the DMG band. The DMG STA may perform other additional or alternative functionality. Other embodiments may be implemented by any other apparatus, device and/or station.

Reference is made to FIG. 1, which schematically illustrates a system 100, in accordance with some demonstrative embodiments.

As shown in FIG. 1, in some demonstrative embodiments, system 100 may include one or more wireless communication devices. For example, system 100 may include a first wireless communication device 102, and/or a second wireless communication device 140.

In some demonstrative embodiments, devices 102 and/or 140 may include a mobile device or a non-mobile, e.g., a static, device.

For example, devices 102 and/or 140 may include, for example, a UE, an MD, a STA, an AP, a PC, a desktop computer, a mobile computer, a laptop computer, an Ultrabook™ computer, a notebook computer, a tablet computer, a server computer, a handheld computer, an Internet of Things (IoT) device, a sensor device, a handheld device, a wearable device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a mobile phone, a cellular telephone, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a media player, a Smartphone, a television, a music player, or the like.

In some demonstrative embodiments, device 102 may include, for example, one or more of a processor 191, an input unit 192, an output unit 193, a memory unit 194, and/or a storage unit 195; and/or device 140 may include, for example, one or more of a processor 181, an input unit 182, an output unit 183, a memory unit 184, and/or a storage unit 185. Devices 102 and/or 140 may optionally include other suitable hardware components and/or software components. In some demonstrative embodiments, some or all of the components of one or more of devices 102 and/or 140 may be enclosed in a common housing or packaging, and may be interconnected or operably associated using one or more wired or wireless links. In other embodiments, components of one or more of devices 102 and/or 140 may be distributed among multiple or separate devices.

In some demonstrative embodiments, processor 191 and/or processor 181 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 191 may execute instructions, for example, of an Operating System (OS) of device 102 and/or of one or more suitable applications. Processor 181 may execute instructions, for example, of an Operating System (OS) of device 140 and/or of one or more suitable applications.

In some demonstrative embodiments, input unit 192 and/or input unit 182 may include, for example, a keyboard, a keypad, a mouse, a touch-screen, a touch-pad, a track-ball, a stylus, a microphone, or other suitable pointing device or input device. Output unit 193 and/or output unit 183 may include, for example, a monitor, a screen, a touch-screen, a flat panel display, a Light Emitting Diode (LED) display unit, a Liquid Crystal Display (LCD) display unit, a plasma display unit, one or more audio speakers or earphones, or other suitable output devices.

In some demonstrative embodiments, memory unit 194 and/or memory unit 184 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 195 and/or storage unit 185 may include, for example, a hard disk drive, a floppy disk drive, a Compact Disk (CD) drive, a CD-ROM drive, a DVD drive, or other suitable removable or non-removable storage units. Memory unit 194 and/or storage unit 195, for example, may store data processed by device 102. Memory unit 184 and/or storage unit 185, for example, may store data processed by device 140.

In some demonstrative embodiments, device 102 and/or device 140 may include and/or perform the functionality of one or more STAs. For example, device 102 may include at least one STA, and/or device 140 may include at least one STA.

In some demonstrative embodiments, device 102 and/or device 140 may include, operate as, and/or perform the functionality of one or more DMG STAs. For example, device 102 may include, operate as, and/or perform the functionality of, at least one DMG STA, and/or device 140 may include, operate as, and/or perform the functionality of, at least one DMG STA.

In other embodiments, devices 102 and/or 140 may perform the functionality of any other wireless device and/or station, e.g., a WLAN STA, a WiFi STA, and the like.

In some demonstrative embodiments, device 102 and/or device 140 may be configured to operate as, and/or perform the functionality of, an access point (AP), e.g., a DMG AP, and/or a personal basic service set (PBSS) control point (PCP), e.g., a DMG PCP, for example, an AP/PCP STA, e.g., a DMG AP/PCP STA.

In some demonstrative embodiments, device 102 and/or device 140 may be configured to operate as, and/or perform the functionality of, a non-AP STA, e.g., a DMG non-AP STA, and/or a non-PCP STA, e.g., a DMG non-PCP STA, for example, a non-AP/PCP STA, e.g., a DMG non-AP/PCP STA.

In other embodiments, device 102 and/or device 140 may perform the functionality of any other additional or alternative device and/or station.

In one example, a station (STA) may include a logical entity that is a singly addressable instance of a medium access control (MAC) and physical layer (PHY) interface to the wireless medium (WM). The STA may perform any other additional or alternative functionality.

In one example, an AP may include an entity that contains a station (STA), e.g., one STA, and provides access to distribution services, via the wireless medium (WM) for associated STAs. The AP may perform any other additional or alternative functionality.

In one example, a personal basic service set (PBSS) control point (PCP) may include an entity that contains a STA, e.g., one station (STA), and coordinates access to the wireless medium (WM) by STAs that are members of a PBSS. The PCP may perform any other additional or alternative functionality.

In one example, a PBSS may include a directional multi-gigabit (DMG) basic service set (BSS) that includes, for example, one PBSS control point (PCP). For example, access to a distribution system (DS) may not be present, but, for example, an intra-PBSS forwarding service may optionally be present.

In one example, a PCP/AP STA may include a station (STA) that is at least one of a PCP or an AP. The PCP/AP STA may perform any other additional or alternative functionality.

In one example, a non-AP STA may include a STA that is not contained within an AP. The non-AP STA may perform any other additional or alternative functionality.

In one example, a non-PCP STA may include a STA that is not a PCP. The non-PCP STA may perform any other additional or alternative functionality.

In one example, a non PCP/AP STA may include a STA that is not a PCP and that is not an AP. The non-PCP/AP STA may perform any other additional or alternative functionality.

In some demonstrative embodiments, wireless communication device 102 and/or device 140 may be capable of communicating content, data, information and/or signals via a wireless medium (WM) 103. In some demonstrative embodiments, wireless medium 103 may include, for example, a radio channel, a cellular channel, an RF channel, a WiFi channel, an IR channel, a Bluetooth (BT) channel, a Global Navigation Satellite System (GNSS) Channel, and the like.

In some demonstrative embodiments, WM 103 may include one or more directional bands and/or channels. For example, WM 103 may include one or more millimeter-wave (mmWave) wireless communication bands and/or channels.

In some demonstrative embodiments, WM 103 may include one or more DMG bands and/or channels. In other embodiments WM 103 may include any other directional channels.

In some demonstrative embodiments, device 102 and/or device 140 may include one or more radios including circuitry and/or logic to perform wireless communication between devices 102, 140 and/or one or more other wireless communication devices. For example, device 102 may include at least one radio 114, and/or device 140 may include at least one radio 144.

In some demonstrative embodiments, radio 114 and/or radio 144 may include one or more wireless receivers (Rx) including circuitry and/or logic to receive wireless communication signals, RF signals, frames, blocks, transmission streams, packets, messages, data items, and/or data. For example, radio 114 may include at least one receiver 116, and/or radio 144 may include at least one receiver 146.

In some demonstrative embodiments, radio 114 and/or radio 144 may include one or more wireless transmitters (Tx) including circuitry and/or logic to transmit wireless communication signals, RF signals, frames, blocks, transmission streams, packets, messages, data items, and/or data. For example, radio 114 may include at least one transmitter 118, and/or radio 144 may include at least one transmitter 148.

In some demonstrative embodiments, radio 114 and/or radio 144, transmitters 118 and/or 148, and/or receivers 116 and/or 148 may include circuitry; logic; Radio Frequency (RF) elements, circuitry and/or logic; baseband elements, circuitry and/or logic; modulation elements, circuitry and/or logic; demodulation elements, circuitry and/or logic; amplifiers; analog to digital and/or digital to analog converters; filters; and/or the like. For example, radio 114 and/or radio 144 may include or may be implemented as part of a wireless Network Interface Card (NIC), and the like.

In some demonstrative embodiments, radios 114 and/or 144 may be configured to communicate over a directional band, for example, an mmWave band, and/or any other band, for example, a 2.4 GHz band, a 5 GHz band, an S1G band, and/or any other band.

In some demonstrative embodiments, radio 114 and/or radio 144 may include, or may be associated with, one or more antennas 107 and/or 147, respectively.

In one example, device 102 may include a single antenna 107. In another example, device 102 may include two or more antennas 107.

In one example, device 140 may include a single antenna 147. In another example, device 140 may include two or more antennas 147.

Antennas 107 and/or 147 may include any type of antennas suitable for transmitting and/or receiving wireless communication signals, blocks, frames, transmission streams, packets, messages and/or data. For example, antennas 107 and/or 147 may include any suitable configuration, structure and/or arrangement of one or more antenna elements, components, units, assemblies and/or arrays. Antennas 107 and/or 147 may include, for example, antennas suitable for directional communication, e.g., using beamforming techniques. For example, antennas 107 and/or 147 may include a phased array antenna, a multiple element antenna, a set of switched beam antennas, and/or the like. In some embodiments, antennas 107 and/or 147 may implement transmit and receive functionalities using separate transmit and receive antenna elements. In some embodiments, antennas 107 and/or 147 may implement transmit and receive functionalities using common and/or integrated transmit/receive elements.

In some demonstrative embodiments, antennas 107 and/or 147 may include a directional antenna, which may be steered to a plurality of beam directions.

In some demonstrative embodiments, device 102 may include a controller 124, and/or device 140 may include a controller 154. Controller 124 may be configured to perform and/or to trigger, cause, instruct and/or control device 102 to perform, one or more communications, to generate and/or communicate one or more messages and/or transmissions, and/or to perform one or more functionalities, operations and/or procedures between devices 102, 140 and/or one or more other devices; and/or controller 154 may be configured to perform, and/or to trigger, cause, instruct and/or control device 140 to perform, one or more communications, to generate and/or communicate one or more messages and/or transmissions, and/or to perform one or more functionalities, operations and/or procedures between devices 102, 140 and/or one or more other devices, e.g., as described below.

In some demonstrative embodiments, controllers 124 and/or 154 may include circuitry and/or logic, e.g., one or more processors including circuitry and/or logic, memory circuitry and/or logic, Media-Access Control (MAC) circuitry and/or logic, Physical Layer (PHY) circuitry and/or logic, and/or any other circuitry and/or logic, configured to perform the functionality of controllers 124 and/or 154, respectively. Additionally or alternatively, one or more functionalities of controllers 124 and/or 154 may be implemented by logic, which may be executed by a machine and/or one or more processors, e.g., as described below.

In one example, controller 124 may include circuitry and/or logic, for example, one or more processors including circuitry and/or logic, to cause, trigger and/or control a wireless device, e.g., device 102, and/or a wireless station, e.g., a wireless STA implemented by device 102, to perform one or more operations, communications and/or functionalities, e.g., as described herein.

In one example, controller 154 may include circuitry and/or logic, for example, one or more processors including circuitry and/or logic, to cause, trigger and/or control a wireless device, e.g., device 140, and/or a wireless station, e.g., a wireless STA implemented by device 140, to perform one or more operations, communications and/or functionalities, e.g., as described herein.

In some demonstrative embodiments, device 102 may include a message processor 128 configured to generate, process and/or access one or messages communicated by device 102.

In one example, message processor 128 may be configured to generate one or more messages to be transmitted by device 102, and/or message processor 128 may be configured to access and/or to process one or more messages received by device 102, e.g., as described below.

In some demonstrative embodiments, device 140 may include a message processor 158 configured to generate, process and/or access one or messages communicated by device 140.

In one example, message processor 158 may be configured to generate one or more messages to be transmitted by device 140, and/or message processor 158 may be configured to access and/or to process one or more messages received by device 140, e.g., as described below.

In some demonstrative embodiments, message processors 128 and/or 158 may include circuitry and/or logic, e.g., one or more processors including circuitry and/or logic, memory circuitry and/or logic, Media-Access Control (MAC) circuitry and/or logic, Physical Layer (PHY) circuitry and/or logic, and/or any other circuitry and/or logic, configured to perform the functionality of message processors 128 and/or 158, respectively. Additionally or alternatively, one or more functionalities of message processors 128 and/or 158 may be implemented by logic, which may be executed by a machine and/or one or more processors, e.g., as described below.

In some demonstrative embodiments, at least part of the functionality of message processor 128 may be implemented as part of radio 114, and/or at least part of the functionality of message processor 158 may be implemented as part of radio 144.

In some demonstrative embodiments, at least part of the functionality of message processor 128 may be implemented as part of controller 124, and/or at least part of the functionality of message processor 158 may be implemented as part of controller 154.

In other embodiments, the functionality of message processor 128 may be implemented as part of any other element of device 102, and/or the functionality of message processor 158 may be implemented as part of any other element of device 140.

In some demonstrative embodiments, at least part of the functionality of controller 124 and/or message processor 128 may be implemented by an integrated circuit, for example, a chip, e.g., a System on Chip (SoC). In one example, the chip or SoC may be configured to perform one or more functionalities of radio 114. For example, the chip or SoC may include one or more elements of controller 124, one or more elements of message processor 128, and/or one or more elements of radio 114. In one example, controller 124, message processor 128, and radio 114 may be implemented as part of the chip or SoC.

In other embodiments, controller 124, message processor 128 and/or radio 114 may be implemented by one or more additional or alternative elements of device 102.

In some demonstrative embodiments, at least part of the functionality of controller 154 and/or message processor 158 may be implemented by an integrated circuit, for example, a chip, e.g., a System on Chip (SoC). In one example, the chip or SoC may be configured to perform one or more functionalities of radio 144. For example, the chip or SoC may include one or more elements of controller 154, one or more elements of message processor 158, and/or one or more elements of radio 144. In one example, controller 154, message processor 158, and radio 144 may be implemented as part of the chip or SoC.

In other embodiments, controller 154, message processor 158 and/or radio 144 may be implemented by one or more additional or alternative elements of device 140.

Some communications over a wireless communication band, for example, a DMG band or any other band, may be performed over a single channel bandwidth (BW). For example, the *IEEE 802.11ad Specification* defines a 60 GHz system with a single channel bandwidth (BW) of 2.16 GHz, which is to be used by all Stations (STAs) for both transmission and reception.

In some demonstrative embodiments, device 102 and/or device 140 may be configured to implement one or more mechanisms, which may, for example, enable to extend a single-channel BW scheme, e.g., a scheme in accordance with the *IEEE 802.11ad Specification* or any other scheme, for higher data rates and/or increased capabilities, e.g., as described below.

In some demonstrative embodiments, device 102 and/or device 140 may be configured to implement one or more channel bonding mechanisms, which may, for example, support communication over bonded channels.

In some demonstrative embodiments, the channel bonding mechanisms may include, for example, a mechanism and/or an operation whereby two or more channels can be combined, e.g., for a higher bandwidth of packet transmission, for example, to enable achieving higher data rates, e.g., when compared to transmissions over a single channel.

Some demonstrative embodiments are described herein with respect to communication over a bonded channel, however other embodiments may be implemented with respect to communications over a channel, e.g., a "wide" channel, including or formed by two or more channels, for example, an aggregated channel including an aggregation of two or more channels.

In some demonstrative embodiments, device 102 and/or device 140 may be configured to implement one or more channel bonding mechanisms, which may, for example, support an increased channel bandwidth, for example, a channel BW of 4.32 GHz, a channel BW of 6.48 GHz, and/or any other additional or alternative channel BW.

In some demonstrative embodiments, devices 102 and/or 140 may be configured to communicate over a Next Generation 60 GHz (NG60) network, an Extended DMG (EDMG) network, and/or any other network. For example, devices 102 and/or 140 may be configured to use channel bonding, for example, for communicating over the NG60 and/or EDMG networks.

Some Specifications, e.g., an IEEE 802.11ad Specification, may be configured to support a Single User (SU) system, in which a Station (STA) cannot transmit frames to more than a single STA at a time. Such Specifications may not be able, for example, to support a STA transmitting to multiple STAs simultaneously, for example, using a multi-user MIMO (MU-MIMO) scheme, e.g., a downlink (DL) MU-MIMO, or any other MU scheme.

In some demonstrative embodiments, devices 102 and/or 140 may be configured to implement one or more Multi-User (MU) mechanisms. For example, devices 102 and/or 140 may be configured to implement one or more MU mechanisms, which may be configured to enable MU communication of Downlink (DL) frames using a Multiple-Input-Multiple-Output (MIMO) scheme, for example, between a device, e.g., device 102, and a plurality of devices, e.g., including device 140 and/or one or more other devices.

In some demonstrative embodiments, devices 102 and/or 140 may be configured to communicate over a Next Generation 60 GHz (NG60) network, an Extended DMG (EDMG) network, and/or any other network. For example, devices 102 and/or 140 may be configured to communicate MIMO, e.g., DL MU-MIMO, transmissions and/or use channel bonding, for example, for communicating over the NG60 and/or EDMG networks.

In some demonstrative embodiments, devices 102 and/or 140 may be configured to process a Control Trailer, which may be added to, appended to, and/or included in, one or more messages, for example, one or more Physical Layer Convergence Protocol (PLCP) Protocol Data Units (PPDUs), e.g., one or more EDMG PPDUs, which may be transmitted, for example, using a Control mode, e.g., as described below.

In some demonstrative embodiments, devices 102 and/or 140 may be configured to support one or more mechanisms and/or features, for example, channel bonding, single user (SU) MIMO, and/or and multi user (MU) MIMO, for example, in accordance with an IEEE 802.11ay standard and/or any other standard and/or protocol.

In some demonstrative embodiments, devices 102 and/or 140 may be configured to support the one or more mechanisms and/or features in a backwards compatible manner, e.g., in a manner which may be compatible with one or more devices ("legacy devices"), which may not support these mechanisms and/or features, e.g., one or more non-EDMG stations, for example, stations configured according to an IEEE 802.11ad standard, and the like.

Some demonstrative embodiments may enable to configure one or more stations (STA), for example, EDMG STAs (also referred to as "11 ay STAs") to transmit frames, e.g., PPDUs, that use the Control mode, e.g., Request to Send (RTS) frames, DMG Clear to Send (CTS) frames, Sector Sweep (SSW) frames, SSW-Feedback frames, and the like, for example, while providing an additional signaling, which may be required to support one or more EDMG features, e.g., channel bonding, MIMO, and/or MU-MIMO; and/or while allowing legacy stations (also referred to as "11ad STAs" or "non-EDMG STAs") to decode the PPDUs that use the Control mode ("the control frames").

In some demonstrative embodiments, some types of frames, for example, management or extension frames, may be extensible, and, accordingly, the additional signaling may be added in a relatively easy manner.

In some demonstrative embodiments, there may be some limitations with respect to some types of frames, for example, control frames, e.g., as described below.

In some demonstrative embodiments, there may not be enough reserved bits available in a header of a control frame, for example, a Control mode header, e.g., as defined by the *IEEE 802.11ad Specification*.

In some demonstrative embodiments, some types of control frames, for example, RTS frames, DMG CTS frames, and the like, may not have reserved bits, which may be used for bandwidth signaling, for example, to support signaling for channel bonding, e.g., as may be required by an IEEE 802.11ay channel bonding mechanism.

In some demonstrative embodiments, some types of control frames, for example, SSW frames, SSW-Feedback frames, SSW-Ack frames, and the like, may not have enough reserved bits, for example, to support MIMO feedback, e.g., for IEEE 802.11 ay MIMO feedback.

Some demonstrative embodiments may be implemented to define a mechanism by which frames, for example, control frames transmitted using the Control mode, may be able to convey additional signaling, which may be, for example, required to support channel bonding and/or MIMO, e.g., according to a IEEE 802.11ay Specification.

Some demonstrative embodiments may enable to implement a control trailer in the control frames, for example, to convey the additional signaling, e.g., as described below.

In some demonstrative embodiments, the control trailer may provide a solution, which may not require, for example, making changes to an encoding process, and/or may have no impact on a performance of a Low Density Parity Check (LDPC) procedure.

In some demonstrative embodiments, the control trailer may provide one or more advantages compared, for example, to an implementation, which may use two bytes of parity bits of an 802.11ad control PHY header code word.

In some demonstrative embodiments, devices 102 and 140 may be configured to utilize a PPDU structure, e.g., a PPDU structure in accordance with an IEEE 802.11ad Specification, to convey the additional signaling, which may be, for example, required to support the channel bonding and/or the MIMO mechanisms.

In some demonstrative embodiments, devices 102 and 140 may utilize a PPDU format, e.g., in accordance with an IEEE 802.11ad Specification, for example, to convey the additional signaling, e.g., in a compatible manner with the IEEE 802.11ad Specification.

Figure 2:
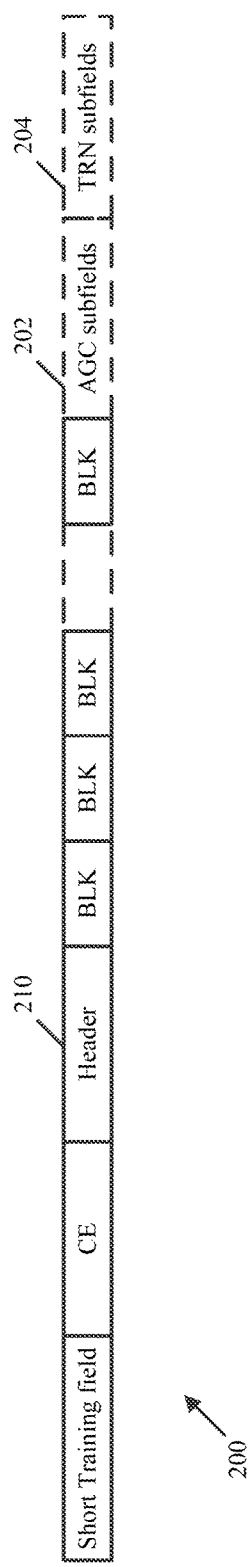
FIG. 2 is a schematic illustration of a Physical Layer Convergence Protocol (PLCP) Protocol Data Unit (PPDU) format, which may be implemented in accordance with some demonstrative embodiments.

Reference is made to FIG. 2, which schematically illustrates, a PPDU format 200, in accordance with some demonstrative embodiments.

In one example, PPDU format 200 may be, for example, in accordance with an *IEEE* 802.11*ad Specification.*

In some demonstrative embodiments, as shown in FIG. 2, PPDU format 200 may include a PLCP header field 210.

In some demonstrative embodiments, a presence of Automatic Gain Control (AGC) subfields 202, and/or Training (TRN) subfields (TRN-Unit) 204 may be indicated in the PLCP Header field 210 of the PPDU format 200.

Referring back to FIG. 1, in some demonstrative embodiments, devices 102 and 140 may utilize a PPDU format 200 (FIG. 2), for example, to convey the additional signaling, e.g., in a compatible manner with the *IEEE* 802.11*ad Specification.*

In some demonstrative embodiments, devices 102 and/or 140 may be configured to signal the presence of one or more TRN-Units, e.g., "fake" TRN-units, at the end of the PPDU format, e.g., PPDU format 200 (FIG. 2), for example, to define a Control Trailer, e.g., as described below.

In some demonstrative embodiments, the control trailer may be interpreted by one or more STAs, for example, EDMG STAs, e.g., devices 102 and/or 140, as carrying the additional signaling.

In some demonstrative embodiments, some stations, for example, a legacy STA, e.g., a legacy 11ad STA, may identify a PPDU format, e.g., PPDU format 200 (FIG. 2), received with a Control Trailer for one or more functionalities, e.g., carrier sense (virtual, physical), and the like, but other than that may ignore one or more fields of the PPDU, for example, since it is not the intended receiver of the PPDU. For example, the legacy STA may interpret the control trailer as one or more training fields, which are to be ignored by the legacy STA, since it is not the intended receiver of the PPDU.

In some demonstrative embodiments, one of devices 102 and 140, e.g., device 140 may generate the PPDU to convey the additional signaling, e.g., as described below.

In some demonstrative embodiments, controller 124 may be configured to control, cause and/or trigger device 102 to generate a PPDU.

In some demonstrative embodiments, the PPDU may include a header field, a payload after the header field, and a control trailer after the payload.

In some demonstrative embodiments, the control trailer may include control information.

In some demonstrative embodiments, the header field may indicate presence of the control trailer.

In some demonstrative embodiments, controller 124 may be configured to control, cause and/or trigger device 102 to transmit the PPDU over a directional wireless communication band.

In one example, message processor 128 may be configured to generate the PPDU including the header, the payload, and the control trailer, and/or transmitter 118 may be configured to transmit the PPDU over the directional wireless communication band, e.g., to device 140.

In some demonstrative embodiments, the PPDU may include a control frame.

In one example, the PPDU may include an RTS frame, or a CTS frame.

In another example, the PPDU may include a SSW frame, an SSW-feedback frame, or an SSW-Acknowledge (Ack) frame.

In another example, the PPDU may include any other control frame.

In some demonstrative embodiments, controller 124 may be configured to control, cause and/or trigger device 102 to set at least one bit in the header field to indicate that the control trailer is present after the payload.

In some demonstrative embodiments, the at least one bit in the header field may include two bits.

In some demonstrative embodiments, the at least one bit in the header field may include a reserved bit.

In some demonstrative embodiments, the header field may include a legacy PLCP header, which may be decodable by a legacy station, e.g., an 11ad STA.

In some demonstrative embodiments, the header field may include a length field configured to indicate a length of the control trailer.

In some demonstrative embodiments, the length field may include a TRN length field.

In some demonstrative embodiments, the control trailer may include Low Density Parity Check (LDPC) codewords.

In some demonstrative embodiments, the control information may include control information for a non-legacy station, e.g., an EDMG STA.

In some demonstrative embodiments, the control information may include one or more EDMG information elements.

In some demonstrative embodiments, the control information may include channel bonding information of a bonded channel.

In some demonstrative embodiments, the control information may include MIMO information to configure a MIMO transmission.

In one example, the control information may include channel bonding information of a bonded channel between devices 102 and 140, and/or MIMO information to be used to communicate a MIMO transmission, e.g., over a bonded channel or a non-bonded channel.

In some demonstrative embodiments, device 140 may receive the PPDU including the header, the payload, and the control trailer.

In some demonstrative embodiments, controller 154 may be configured to control, cause and/or trigger device 140 to process the PPDU received over the directional wireless communication band.

In one example, receiver 146 may be configured to receive the PPDU over the directional wireless communication band, and/or message processor 158 may be configured to process the PPDU including the header, the payload, and the control trailer.

In some demonstrative embodiments, controller 154 may be configured to determine, for example, based on the header field of the PPDU, if a control trailer is present after the payload.

In some demonstrative embodiments, controller 154 may be configured to use the control information in the control trailer, for example, if the control trailer is present after the payload.

In one example, controller 154 may configure a MIMO transmission over the bonded channel between devices 102 and 140, for example, based on the control information.

Figure 3:
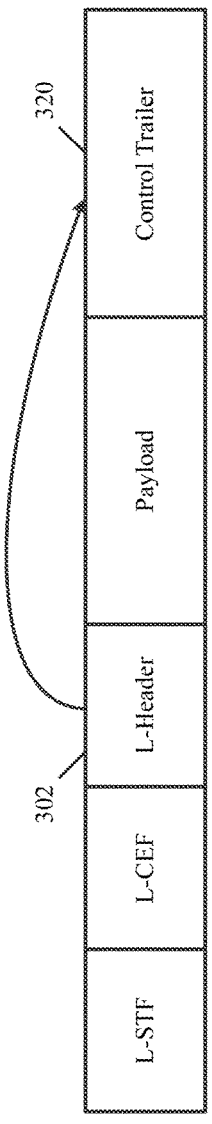
FIG. 3 is a schematic illustration of a PPDU including a control trailer including control information, in accordance with some demonstrative embodiments.

Reference is made to FIG. 3, which schematically illustrates a format of a PPDU 300 including a control trailer 320, which may include control information, in accordance with some demonstrative embodiments.

In some demonstrative embodiments, PPDU 300 may be interpreted by a non-legacy station, e.g., an 11ay STA or an EDMG STA, for example, according to a non-legacy communication standard, e.g., as described below.

In some demonstrative embodiments, device 102 (FIG. 1) may transmit PPDU 300, for example, to convey the control information.

In some demonstrative embodiments, as shown in FIG. 3, PPDU 300 may include the control trailer 320 including the control information.

In some demonstrative embodiments, a STA, for example, an 11ay STA, e.g., device 102 (FIG. 1), may be configured to signal the presence of, e.g., fake, TRN-Units at the end of the PPDU 300 to define Control Trailer 320.

In some demonstrative embodiments, as shown in FIG. 3, PPDU 300 may signal the presence of the Control Trailer 320 in a backwards compatible manner, for example, by setting, in a legacy PLCP header 302 (also referred to as "L-Header"), the length field to a number of TRN-Units, e.g., 2 or any other number, and setting a Packet Type field to 1 in a control mode header of the PPDU.

In some demonstrative embodiments, a STA, for example, an 11ay STA, e.g., device 102, may be configured to use at least one bit, for example, two bits, in the legacy PLCP header 302, to indicate that Control Trailer 320 is present, and that at least some of the TRN-Units, e.g., the "fake" TRN units at the end of the PPDU 300, shall be interpreted by a receiver of the PPDU 300 as Control Trailer 320, which is carrying the control information, e.g., in an LDPC encoded form.

In some demonstrative embodiments, device 102 (FIG. 1) may be configured to set at least one bit in header 302, for example, two bits, which may be configured as a Control Trailer Present field to indicate presence of the control trailer 320.

In some demonstrative embodiments, device 102 (FIG. 1) may be configured to set at least one reserved bit in header 302 to indicate presence of the control trailer 320.

In some demonstrative embodiments, device 102 (FIG. 1) may be configured to set at least one bit, for example, two bits, in header 302 to a predefined value, e.g., a reserved value, which may indicate presence of control trailer.

For example, device 102 (FIG. 1) may be configured to set the Control Trailer present field to a predefined value to indicate presence of control trailer 320.

In other embodiments, any other one or more bits and/or any other indicator value or field may be used to indicate the presence of control trailer 320.

In some demonstrative embodiment, device 102 (FIG. 1) may encode contents of the control trailer, for example, using an LDPC code, e.g., of an LDPC code of an IEEE 802.11ad control mode PPDU, and/or device 102 (FIG. 1) may modulate the control trailer using a modulation scheme e.g., of an IEEE 802.11ad control mode PPDU.

In some demonstrative embodiments, a STA receiving PPDU 300, for example, an 11ay STA, e.g., device 140 (FIG. 1), may be configured to process the control information included in the control trailer 320, for example, based on decoding of the PLCP header field 302.

In some demonstrative embodiments, device 140 (FIG. 1) may be configured to process header 302 to determine that the control trailer 320 is present, e.g., based on the Control Trailer Present field.

In some demonstrative embodiments, device 140 (FIG. 1) may be configured to process the Control Trailer 320 as carrying data, and may decode the control trailer 320, for example, using an LDPC decoder.

In some demonstrative embodiments, the STA transmitting PPDU 300, e.g., device 102 (FIG. 1), may be configured to set a value in the Training Length field in the PLCP header 302 to indicate a size or length of the Control Trailer 320, e.g., as described below3.

In some demonstrative embodiments, the size of the Control Trailer 320 may be set to a default size.

In some demonstrative embodiments, the default size may be set, for example, to be enough to fit, for example, one or more, e.g., even all, envisioned information to be provided in control trailer 320.

In some demonstrative embodiments, device 102 (FIG. 1) may be configured to set a length field, for example, a TRN-length field, in the PLCP header 302 to a default length value corresponding to the default size of control trailer 320.

In one example, the default length value of the TRN-length field may be set, for example, to 2. For example, the length value of 2 may indicate a length of two TRN units, which may be enough to fit 18 bytes of data in the Control Trailer 320. According to this example, the 18 bytes may be enough to support, for example, one or more, e.g., even all, envisioned usages, e.g., including at least bandwidth signaling, MIMO signaling, and the like. In other embodiments, any other value may be used and/or the Control Trailer may have any other length.

In one example, the value of 2 TRN units may be determined, for example, based on one or more assumptions or parameters, e.g., as follows.

In some demonstrative embodiments, the length of a TRN-Unit may be equal, for example, to the sum of the lengths of 4 AGC fields, 4 TRN fields, and a CE field.

In some demonstrative embodiments, the training length value may be set to 2, and the packet type may be set to 1.

In some demonstrative embodiments, a length of two TRN-Units may be calculated, for example, when the training length value is 2 and the packet type is set to "1", e.g., as 2×(4×5×64+4×5×128+9×182)=2×4992 chips, for example, at 1760 MHz. Accordingly, the length of the two TRN-Units may be determined, e.g., as 2×4992=32×8×8 LDPC code words.

In some demonstrative embodiments, the length of the two TRN-Units may be more than enough to carry 18 bytes of data, which may be enough to support, for example, even all envisioned usages for the control trailer 320.

Some demonstrative embodiments, e.g., as described above, may be implemented, for example, at least to addresses a major requirement, which may arise in some cases and/or implementations, for example, with respect to an *IEEE 802.11ay Specification*, for example, in a fully backwards compatible manner.

In some demonstrative embodiments, the Control Trailer 320, e.g., as described above, may be implemented, for example, to support one or more IEEE 802.11ay features.

In some demonstrative embodiments, a specific format and/or content of the Control Trailer 320 may be configured, for example, based on the type and/or subtype of a frame in which the control trailer is to be transmitted.

In one example, in some frames, for example, an RTS frame and/or a DMG CTS frame, the control trailer 320 may be configured and/or used to carry bandwidth signaling, for example, information for channel bonding.

In another example, in some frames, for example, an SSW frame, an SSW-Feedback frame, and/or an SSW-ACK frame, the control trailer 320 may be configured and/or used to carry MIMO feedback and/or any other MIMO information.

In another example, in some frames, for example, Grant/Grant ACK frames, the control trailer 320 may be configured and/or used to carry SU-MIMO feedback, MU-MIMO feedback, and/or any other MIMO or MU-MIMO information.

In some demonstrative embodiments, the MIMO feedback in the control trailer may be passed from the PHY to the MAC, for example, through an interface, e.g., different from the data interface.

In some demonstrative embodiments, the control trailer 320 may be configured to carry any other additional or alternative information, for example, control information, additional or alternative MIMO information, additional or alternative channel bonding information, and/or any other type of information.

Figure 4:
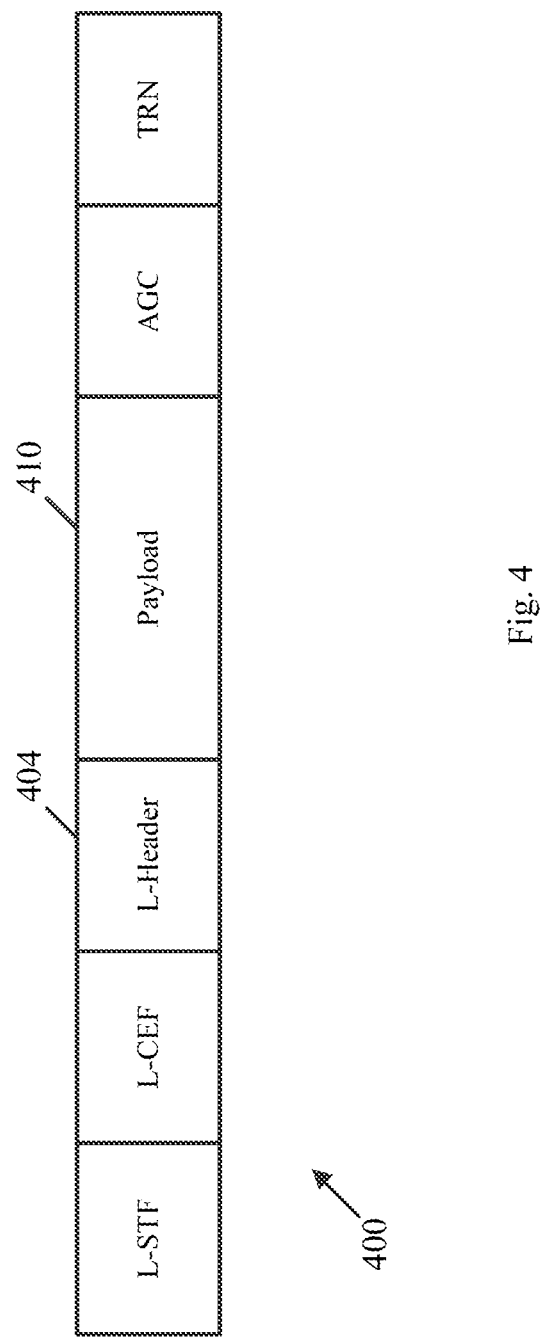
FIG. 4 is a schematic illustration of the PPDU of FIG. 3, as may be interpreted by a station (STA) according to a legacy communication standard, in accordance with some demonstrative embodiments.

Reference is made to FIG. 4, which schematically illustrates a PPDU format 400, by which PPDU 300 (FIG. 3) may be interpreted by a legacy station according to a legacy communication standard, e.g., in accordance with some demonstrative embodiments.

In some demonstrative embodiments, a legacy station, e.g., an 802.11ad STA, may interpret PPDU 300 (FIG. 3), for example, according to a legacy communication standard, e.g., an *IEEE 802.11ad Specification*.

As shown in FIG. 4, PPDU 400, as interpreted by the legacy STA, may be fully compatible with PPDU format 200 (FIG. 2).

In some demonstrative embodiments, a legacy station receiving PPDU 300 (FIG. 3) including the control Trailer 320 (FIG. 3), may still be able to correctly decode, e.g., by the PHY of the legacy station, a payload 410 of the PPDU 400, which will have the same length as payload 210 (FIG. 2).

In some demonstrative embodiments, the legacy station may still be able to correctly determine the duration of PPDU 400, and, accordingly, to correctly set a Network Allocation Vector (NAV), for example, based on a length field in a header 404 (also referred to as "L-Header") of the PPDU 400.

Accordingly, the control trailer 320 (FIG. 3) of PPDU 300 (FIG. 3) as may be interpreted in PPDU 400 may be completely backwards compatible with an IEEE 802.11ad specification.

Figure 5:
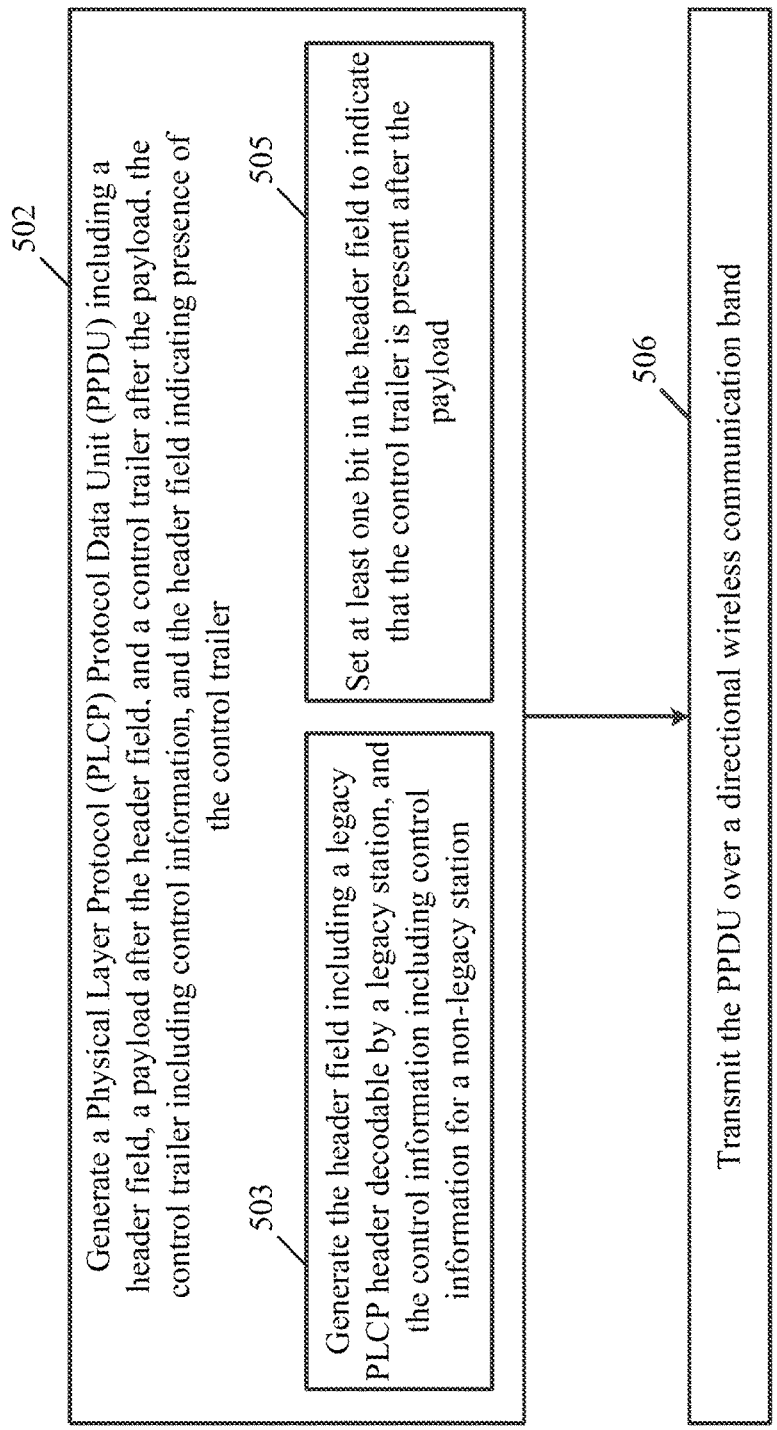
FIG. 5 is a schematic flow-chart illustration of a method of communicating control information in a PPDU, in accordance with some demonstrative embodiments.

Reference is made to FIG. 5, which schematically illustrates a method of communicating control information in a PPDU, in accordance with some demonstrative embodiments. For example, one or more of the operations of the method of FIG. 5 may be performed by one or more elements of a system, e.g., system 100 (FIG. 1), for example, one or more wireless devices, e.g., device 102 (FIG. 1), and/or device 140 (FIG. 1); a controller, e.g., controller 154 (FIG. 1), and/or controller 124 (FIG. 1); a radio, e.g., radio 114 (FIG. 1), and/or radio 144 (FIG. 1); a transmitter, e.g., transmitter 118 (FIG. 1), and/or transmitter 148 (FIG. 1); a receiver e.g., receiver 116 (FIG. 1), and/or receiver 146 (FIG. 1); and/or a message processor, e.g., message processor 128 (FIG. 1), and/or message processor 158 (FIG. 1).

As indicated at block 502, the method may include generating a PPDU including a header field, a payload after the header field, and a control trailer after the payload, the control trailer including control information, and the header field indicating presence of the control trailer. For example, controller 124 (FIG. 1) may be configured to control, cause and/or trigger device 102 (FIG. 1) to generate a PPDU, e.g., PPDU 300 (FIG. 3), including the header field, the payload after the header field, and the control trailer after the payload, e.g., as described above.

As indicated at block 503, generating the PPDU may include generating the header field including a legacy PLCP header decodable by a legacy station, and the control information including control information for a non-legacy station. For example, controller 124 (FIG. 1) may be configured to control, cause and/or trigger device 102 (FIG. 1) to generate the PPDU including the header field, e.g., header field 302 (FIG. 3), decodable by the legacy station and the control information for the non-legacy station in control trailer 320 (FIG. 3), e.g., as described above.

As indicated at block 505, generating the PPDU may include setting at least one bit in the header field to indicate that the control trailer is present after the payload. For example, controller 124 (FIG. 1) may be configured to control, cause and/or trigger device 102 (FIG. 1) to set the at least one bit in the header field to indicate that the control trailer is present after the payload, e.g., as described above.

As indicated at block 506, the method may include transmitting the PPDU over a directional wireless communication band. For example, controller 124 (FIG. 1) may be configured to control, cause and/or trigger device 102 (FIG. 1) to transmit the PPDU, e.g., PPDU 300 (FIG. 3), to device 140 (FIG. 1) over the directional wireless communication band, e.g., as described above.

Figure 6:
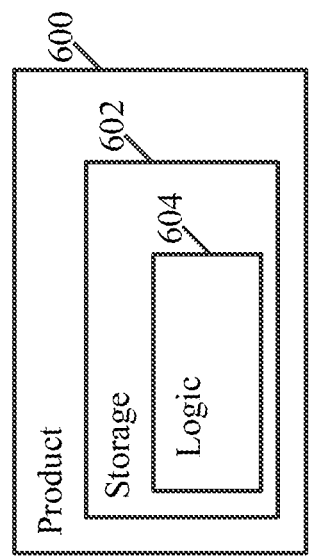
FIG. 6 is a schematic illustration of a product of manufacture, in accordance with some demonstrative embodiments.

Reference is made to FIG. 6, which schematically illustrates a product of manufacture 600, in accordance with some demonstrative embodiments. Product 600 may include one or more tangible computer-readable non-transitory storage media 602, which may include computer-executable instructions, e.g., implemented by logic 604, operable to, when executed by at least one computer processor, enable the at least one computer processor to implement one or more operations at device 102 (FIG. 1), device 140 (FIG. 1), radio 114 (FIG. 1), radio 144 (FIG. 1), transmitter 118 (FIG. 1), transmitter 148 (FIG. 1), receiver 116 (FIG. 1), receiver 146 (FIG. 1), controller 124 (FIG. 1), controller 154 (FIG.

1), message processor 128 (FIG. 1), and/or message processor 158 (FIG. 1), and/or to perform, trigger and/or implement one or more operations, communications and/or functionalities as describe d above with reference to FIGS. 1, 2, 3, 4 and/or 5, and/or one or more operations described herein. The phrase "non-transitory machine-readable medium" is directed to include all computer-readable media, with the sole exception being a transitory propagating signal.

In some demonstrative embodiments, product 600 and/or machine-readable storage medium 602 may include one or more types of computer-readable storage media capable of storing data, including volatile memory, non-volatile memory, removable or non-removable memory, erasable or non-erasable memory, writeable or re-writeable memory, and the like. For example, machine-readable storage medium 602 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative embodiments, logic 604 may include instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative embodiments, logic 604 may include, or may be implemented as, software, firmware, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, C#, Java, Python, BASIC, Matlab, Pascal, Visual BASIC, assembly language, machine code, and the like.

EXAMPLES

The following examples pertain to further embodiments.

Example 1 includes an apparatus comprising logic and circuitry configured to cause a wireless station to generate a Physical Layer Convergence Protocol (PLCP) Protocol Data Unit (PPDU) comprising a header field, a payload after the header field, and a control trailer after the payload, the control trailer comprising control information, the header field indicating presence of the control trailer; and transmit the PPDU over a directional wireless communication band.

Example 2 includes the subject matter of Example 1, and optionally, wherein the apparatus is configured to cause the wireless station to set at least one bit in the header field to indicate that the control trailer is present after the payload.

Example 3 includes the subject matter of Example 2, and optionally, wherein the at least one bit comprises two bits.

Example 4 includes the subject matter of Example 2 or 3, and optionally, wherein the bit comprises a reserved bit.

Example 5 includes the subject matter of any one of Examples 1-4, and optionally, wherein the header field comprises a legacy PLCP header decodable by a legacy station, the control information comprises control information for a non-legacy station.

Example 6 includes the subject matter of any one of Examples 1-5, and optionally, wherein the header field comprises a length field indicating a length of the control trailer.

Example 7 includes the subject matter of Example 6, and optionally, wherein the length field comprises a Training (TRN) length field.

Example 8 includes the subject matter of Example 7, and optionally, wherein the header field comprises a packet type field comprising a value "1".

Example 9 includes the subject matter of any one of Examples 1-8, and optionally, wherein the control trailer comprises Low Density Parity Check (LDPC) codewords.

Example 10 includes the subject matter of any one of Examples 1-9, and optionally, wherein the control information comprises one or more Extended Directional Multi-Gigabit (EDMG) information elements.

Example 11 includes the subject matter of any one of Examples 1-10, and optionally, wherein the control information comprises channel bonding information of a bonded channel.

Example 12 includes the subject matter of any one of Examples 1-11, and optionally, wherein the control information comprises Multiple In Multiple Out (MIMO) information to configure a MIMO transmission.

Example 13 includes the subject matter of any one of Examples 1-12, and optionally, wherein the PPDU comprises a control frame.

Example 14 includes the subject matter of any one of Examples 1-13, and optionally, wherein the PPDU comprises a Request To Send (RTS) frame, or a Clear To Send (CTS) frame.

Example 15 includes the subject matter of any one of Examples 1-13, and optionally, wherein the PPDU comprises a Sector Sweep (SSW) frame, an SSW-feedback frame, or an SSW-Acknowledge (Ack) frame.

Example 16 includes the subject matter of any one of Examples 1-15, and optionally, wherein the wireless station is a Directional Multi-Gigabit (DMG) Station (STA).

Example 17 includes the subject matter of any one of Examples 1-16, and optionally, comprising one or more directional antennas, a memory, and a processor.

Example 18 includes a system of wireless communication comprising a wireless station, the wireless station comprising one or more directional antennas; a memory; a processor; a controller configured to cause the wireless station to generate a Physical Layer Convergence Protocol (PLCP) Protocol Data Unit (PPDU) comprising a header field, a payload after the header field, and a control trailer after the payload, the control trailer comprising control information, the header field indicating presence of the control trailer; and transmit the PPDU over a directional wireless communication band.

Example 19 includes the subject matter of Example 18, and optionally, wherein the controller is configured to cause the wireless station to set at least one bit in the header field to indicate that the control trailer is present after the payload.

Example 20 includes the subject matter of Example 19, and optionally, wherein the at least one bit comprises two bits.

Example 21 includes the subject matter of Example 19 or 20, and optionally, wherein the bit comprises a reserved bit.

Example 22 includes the subject matter of any one of Examples 18-21, and optionally, wherein the header field comprises a legacy PLCP header decodable by a legacy station, the control information comprises control information for a non-legacy station.

Example 23 includes the subject matter of any one of Examples 18-22, and optionally, wherein the header field comprises a length field indicating a length of the control trailer.

Example 24 includes the subject matter of Example 23, and optionally, wherein the length field comprises a Training (TRN) length field.

Example 25 includes the subject matter of Example 24, and optionally, wherein the header field comprises a packet type field comprising a value "1".

Example 26 includes the subject matter of any one of Examples 18-25, and optionally, wherein the control trailer comprises Low Density Parity Check (LDPC) codewords.

Example 27 includes the subject matter of any one of Examples 18-26, and optionally, wherein the control information comprises one or more Extended Directional Multi-Gigabit (EDMG) information elements.

Example 28 includes the subject matter of any one of Examples 18-27, and optionally, wherein the control information comprises channel bonding information of a bonded channel.

Example 29 includes the subject matter of any one of Examples 18-28, and optionally, wherein the control information comprises Multiple In Multiple Out (MIMO) information to configure a MIMO transmission.

Example 30 includes the subject matter of any one of Examples 18-29, and optionally, wherein the PPDU comprises a control frame.

Example 31 includes the subject matter of any one of Examples 18-30, and optionally, wherein the PPDU comprises a Request To Send (RTS) frame, or a Clear To Send (CTS) frame.

Example 32 includes the subject matter of any one of Examples 18-30, and optionally, wherein the PPDU comprises a Sector Sweep (SSW) frame, an SSW-feedback frame, or an SSW-Acknowledge (Ack) frame.

Example 33 includes the subject matter of any one of Examples 18-32, and optionally, wherein the wireless station is a Directional Multi-Gigabit (DMG) Station (STA).

Example 34 includes a method to be performed at a wireless station, the method comprising generating a Physical Layer Convergence Protocol (PLCP) Protocol Data Unit (PPDU) comprising a header field, a payload after the header field, and a control trailer after the payload, the control trailer comprising control information, the header field indicating presence of the control trailer; and transmitting the PPDU over a directional wireless communication band.

Example 35 includes the subject matter of Example 34, and optionally, comprising setting at least one bit in the header field to indicate that the control trailer is present after the payload.

Example 36 includes the subject matter of Example 35, and optionally, wherein the at least one bit comprises two bits.

Example 37 includes the subject matter of Example 35 or 36, and optionally, wherein the bit comprises a reserved bit.

Example 38 includes the subject matter of any one of Examples 34-37, and optionally, wherein the header field comprises a legacy PLCP header decodable by a legacy station, the control information comprises control information for a non-legacy station.

Example 39 includes the subject matter of any one of Examples 34-38, and optionally, wherein the header field comprises a length field indicating a length of the control trailer.

Example 40 includes the subject matter of Example 39, and optionally, wherein the length field comprises a Training (TRN) length field.

Example 41 includes the subject matter of Example 40, and optionally, wherein the header field comprises a packet type field comprising a value "1".

Example 42 includes the subject matter of any one of Examples 34-41, and optionally, wherein the control trailer comprises Low Density Parity Check (LDPC) codewords.

Example 43 includes the subject matter of any one of Examples 34-42, and optionally, wherein the control information comprises one or more Extended Directional Multi-Gigabit (EDMG) information elements.

Example 44 includes the subject matter of any one of Examples 34-43, and optionally, wherein the control information comprises channel bonding information of a bonded channel.

Example 45 includes the subject matter of any one of Examples 34-44, and optionally, wherein the control information comprises Multiple In Multiple Out (MIMO) information to configure a MIMO transmission.

Example 46 includes the subject matter of any one of Examples 34-45, and optionally, wherein the PPDU comprises a control frame.

Example 47 includes the subject matter of any one of Examples 34-46, and optionally, wherein the PPDU comprises a Request To Send (RTS) frame, or a Clear To Send (CTS) frame.

Example 48 includes the subject matter of any one of Examples 34-46, and optionally, wherein the PPDU comprises a Sector Sweep (SSW) frame, an SSW-feedback frame, or an SSW-Acknowledge (Ack) frame.

Example 49 includes the subject matter of any one of Examples 34-48, and optionally, wherein the wireless station is a Directional Multi-Gigabit (DMG) Station (STA).

Example 50 includes a product comprising one or more tangible computer-readable non-transitory storage media comprising computer-executable instructions operable to, when executed by at least one computer processor, enable the at least one computer processor to implement operations at a wireless station, the operations comprising generating a Physical Layer Convergence Protocol (PLCP) Protocol Data Unit (PPDU) comprising a header field, a payload after the header field, and a control trailer after the payload, the control trailer comprising control information, the header field indicating presence of the control trailer; and transmitting the PPDU over a directional wireless communication band.

Example 51 includes the subject matter of Example 50, and optionally, wherein the operations comprise setting at least one bit in the header field to indicate that the control trailer is present after the payload.

Example 52 includes the subject matter of Example 51, and optionally, wherein the at least one bit comprises two bits.

Example 53 includes the subject matter of Example 51 or 52, and optionally, wherein the bit comprises a reserved bit.

Example 54 includes the subject matter of any one of Examples 50-53, and optionally, wherein the header field comprises a legacy PLCP header decodable by a legacy station, the control information comprises control information for a non-legacy station.

Example 55 includes the subject matter of any one of Examples 50-54, and optionally, wherein the header field comprises a length field indicating a length of the control trailer.

Example 56 includes the subject matter of Example 55, and optionally, wherein the length field comprises a Training (TRN) length field.

Example 57 includes the subject matter of Example 56, and optionally, wherein the header field comprises a packet type field comprising a value "1".

Example 58 includes the subject matter of any one of Examples 50-57, and optionally, wherein the control trailer comprises Low Density Parity Check (LDPC) codewords.

Example 59 includes the subject matter of any one of Examples 50-58, and optionally, wherein the control information comprises one or more Extended Directional Multi-Gigabit (EDMG) information elements.

Example 60 includes the subject matter of any one of Examples 50-59, and optionally, wherein the control information comprises channel bonding information of a bonded channel.

Example 61 includes the subject matter of any one of Examples 50-60, and optionally, wherein the control information comprises Multiple In Multiple Out (MIMO) information to configure a MIMO transmission.

Example 62 includes the subject matter of any one of Examples 50-61, and optionally, wherein the PPDU comprises a control frame.

Example 63 includes the subject matter of any one of Examples 50-62, and optionally, wherein the PPDU comprises a Request To Send (RTS) frame, or a Clear To Send (CTS) frame.

Example 64 includes the subject matter of any one of Examples 50-62, and optionally, wherein the PPDU comprises a Sector Sweep (SSW) frame, an SSW-feedback frame, or an SSW-Acknowledge (Ack) frame.

Example 65 includes the subject matter of any one of Examples 50-64, and optionally, wherein the wireless station is a Directional Multi-Gigabit (DMG) Station (STA).

Example 66 includes an apparatus of wireless communication by a wireless station, the apparatus comprising means for generating a Physical Layer Convergence Protocol (PLCP) Protocol Data Unit (PPDU) comprising a header field, a payload after the header field, and a control trailer after the payload, the control trailer comprising control information, the header field indicating presence of the control trailer; and means for transmitting the PPDU over a directional wireless communication band.

Example 67 includes the subject matter of Example 66, and optionally, comprising means for setting at least one bit in the header field to indicate that the control trailer is present after the payload.

Example 68 includes the subject matter of Example 67, and optionally, wherein the at least one bit comprises two bits.

Example 69 includes the subject matter of Example 67 or 68, and optionally, wherein the bit comprises a reserved bit.

Example 70 includes the subject matter of any one of Examples 66-69, and optionally, wherein the header field comprises a legacy PLCP header decodable by a legacy station, the control information comprises control information for a non-legacy station.

Example 71 includes the subject matter of any one of Examples 66-70, and optionally, wherein the header field comprises a length field indicating a length of the control trailer.

Example 72 includes the subject matter of Example 71, and optionally, wherein the length field comprises a Training (TRN) length field.

Example 73 includes the subject matter of Example 72, and optionally, wherein the header field comprises a packet type field comprising a value "1".

Example 74 includes the subject matter of any one of Examples 66-73, and optionally, wherein the control trailer comprises Low Density Parity Check (LDPC) codewords.

Example 75 includes the subject matter of any one of Examples 66-74, and optionally, wherein the control information comprises one or more Extended Directional Multi-Gigabit (EDMG) information elements.

Example 76 includes the subject matter of any one of Examples 66-75, and optionally, wherein the control information comprises channel bonding information of a bonded channel.

Example 77 includes the subject matter of any one of Examples 66-76, and optionally, wherein the control information comprises Multiple In Multiple Out (MIMO) information to configure a MIMO transmission.

Example 78 includes the subject matter of any one of Examples 66-77, and optionally, wherein the PPDU comprises a control frame.

Example 79 includes the subject matter of any one of Examples 66-78, and optionally, wherein the PPDU comprises a Request To Send (RTS) frame, or a Clear To Send (CTS) frame.

Example 80 includes the subject matter of any one of Examples 66-78, and optionally, wherein the PPDU comprises a Sector Sweep (SSW) frame, an SSW-feedback frame, or an SSW-Acknowledge (Ack) frame.

Example 81 includes the subject matter of any one of Examples 66-80, and optionally, wherein the wireless station is a Directional Multi-Gigabit (DMG) Station (STA).

Example 82 includes an apparatus comprising logic and circuitry configured to cause a wireless station to process a header field of a Physical Layer Convergence Protocol (PLCP) Protocol Data Unit (PPDU) received over a directional wireless communication band, the PPDU comprises a payload after the header field, the header field indicating presence of a control trailer after the payload, the control trailer comprising control information; and process the control trailer.

Example 83 includes the subject matter of Example 82, and optionally, wherein the header comprises at least one bit to indicate that the control trailer is present after the payload.

Example 84 includes the subject matter of Example 83, and optionally, wherein the at least one bit comprises two bits.

Example 85 includes the subject matter of Example 83 or 84, and optionally, wherein the bit comprises a reserved bit.

Example 86 includes the subject matter of any one of Examples 82-85, and optionally, wherein the wireless station is a non-legacy station, the header field comprises a legacy PLCP header decodable by a legacy station, the control information comprises control information for the non-legacy station.

Example 87 includes the subject matter of any one of Examples 82-86, and optionally, wherein the header field comprises a length field indicating a length of the control trailer.

Example 88 includes the subject matter of Example 87, and optionally, wherein the length field comprises a Training (TRN) length field.

Example 89 includes the subject matter of Example 88, and optionally, wherein the header field comprises a packet type field comprising a value "1".

Example 90 includes the subject matter of any one of Examples 82-89, and optionally, wherein the control trailer comprises Low Density Parity Check (LDPC) codewords.

Example 91 includes the subject matter of any one of Examples 82-90, and optionally, wherein the control information comprises one or more Extended Directional Multi-Gigabit (EDMG) information elements.

Example 92 includes the subject matter of any one of Examples 82-91, and optionally, wherein the control information comprises channel bonding information of a bonded channel.

Example 93 includes the subject matter of any one of Examples 82-92, and optionally, wherein the control information comprises Multiple In Multiple Out (MIMO) information to configure a MIMO transmission.

Example 94 includes the subject matter of any one of Examples 82-93, and optionally, wherein the PPDU comprises a control frame.

Example 95 includes the subject matter of any one of Examples 82-94, and optionally, wherein the PPDU comprises a Request To Send (RTS) frame, or a Clear To Send (CTS) frame.

Example 96 includes the subject matter of any one of Examples 82-94, and optionally, wherein the PPDU comprises a Sector Sweep (SSW) frame, an SSW-feedback frame, or an SSW-Acknowledge (Ack) frame.

Example 97 includes the subject matter of any one of Examples 82-96, and optionally, wherein the wireless station is a Directional Multi-Gigabit (DMG) Station (STA).

Example 98 includes the subject matter of any one of Examples 82-97, and optionally, comprising one or more directional antennas, a memory, and a processor.

Example 99 includes a system of wireless communication comprising a wireless station, the wireless station comprising one or more directional antennas; a memory; a processor; a controller configured to cause the wireless station to process a header field of a Physical Layer Convergence Protocol (PLCP) Protocol Data Unit (PPDU) received over a directional wireless communication band, the PPDU comprises a payload after the header field, the header field indicating presence of a control trailer after the payload, the control trailer comprising control information; and process the control trailer.

Example 100 includes the subject matter of Example 99, and optionally, wherein the header comprises at least one bit to indicate that the control trailer is present after the payload.

Example 101 includes the subject matter of Example 100, and optionally, wherein the at least one bit comprises two bits.

Example 102 includes the subject matter of Example 100 or 101, and optionally, wherein the bit comprises a reserved bit.

Example 103 includes the subject matter of any one of Examples 99-102, and optionally, wherein the wireless station is a non-legacy station, the header field comprises a legacy PLCP header decodable by a legacy station, the control information comprises control information for the non-legacy station.

Example 104 includes the subject matter of any one of Examples 99-103, and optionally, wherein the header field comprises a length field indicating a length of the control trailer.

Example 105 includes the subject matter of Example 104, and optionally, wherein the length field comprises a Training (TRN) length field.

Example 106 includes the subject matter of Example 105, and optionally, wherein the header field comprises a packet type field comprising a value "1".

Example 107 includes the subject matter of any one of Examples 99-106, and optionally, wherein the control trailer comprises Low Density Parity Check (LDPC) codewords.

Example 108 includes the subject matter of any one of Examples 99-107, and optionally, wherein the control information comprises one or more Extended Directional Multi-Gigabit (EDMG) information elements.

Example 109 includes the subject matter of any one of Examples 99-108, and optionally, wherein the control information comprises channel bonding information of a bonded channel.

Example 110 includes the subject matter of any one of Examples 99-109, and optionally, wherein the control information comprises Multiple In Multiple Out (MIMO) information to configure a MIMO transmission.

Example 111 includes the subject matter of any one of Examples 99-110, and optionally, wherein the PPDU comprises a control frame.

Example 112 includes the subject matter of any one of Examples 99-111, and optionally, wherein the PPDU comprises a Request To Send (RTS) frame, or a Clear To Send (CTS) frame.

Example 113 includes the subject matter of any one of Examples 99-111, and optionally, wherein the PPDU comprises a Sector Sweep (SSW) frame, an SSW-feedback frame, or an SSW-Acknowledge (Ack) frame.

Example 114 includes the subject matter of any one of Examples 99-113, and optionally, wherein the wireless station is a Directional Multi-Gigabit (DMG) Station (STA).

Example 115 includes a method to be performed at a wireless station, the method comprising processing a header field of a Physical Layer Convergence Protocol (PLCP) Protocol Data Unit (PPDU) received over a directional wireless communication band, the PPDU comprises a payload after the header field, the header field indicating presence of a control trailer after the payload, the control trailer comprising control information; and processing the control trailer.

Example 116 includes the subject matter of Example 115, and optionally, wherein the header comprises at least one bit to indicate that the control trailer is present after the payload.

Example 117 includes the subject matter of Example 116, and optionally, wherein the at least one bit comprises two bits.

Example 118 includes the subject matter of Example 116 or 117, and optionally, wherein the bit comprises a reserved bit.

Example 119 includes the subject matter of any one of Examples 115-118, and optionally, wherein the wireless station is a non-legacy station, the header field comprises a legacy PLCP header decodable by a legacy station, the control information comprises control information for the non-legacy station.

Example 120 includes the subject matter of any one of Examples 115-119, and optionally, wherein the header field comprises a length field indicating a length of the control trailer.

Example 121 includes the subject matter of Example 120, and optionally, wherein the length field comprises a Training (TRN) length field.

Example 122 includes the subject matter of Example 121, and optionally, wherein the header field comprises a packet type field comprising a value "1".

Example 123 includes the subject matter of any one of Examples 115-122, and optionally, wherein the control trailer comprises Low Density Parity Check (LDPC) codewords.

Example 124 includes the subject matter of any one of Examples 115-123, and optionally, wherein the control information comprises one or more Extended Directional Multi-Gigabit (EDMG) information elements.

Example 125 includes the subject matter of any one of Examples 115-124, and optionally, wherein the control information comprises channel bonding information of a bonded channel.

Example 126 includes the subject matter of any one of Examples 115-125, and optionally, wherein the control information comprises Multiple In Multiple Out (MIMO) information to configure a MIMO transmission.

Example 127 includes the subject matter of any one of Examples 115-126, and optionally, wherein the PPDU comprises a control frame.

Example 128 includes the subject matter of any one of Examples 115-127, and optionally, wherein the PPDU comprises a Request To Send (RTS) frame, or a Clear To Send (CTS) frame.

Example 129 includes the subject matter of any one of Examples 115-127, and optionally, wherein the PPDU comprises a Sector Sweep (SSW) frame, an SSW-feedback frame, or an SSW-Acknowledge (Ack) frame.

Example 130 includes the subject matter of any one of Examples 115-129, and optionally, wherein the wireless station is a Directional Multi-Gigabit (DMG) Station (STA).

Example 131 includes a product comprising one or more tangible computer-readable non-transitory storage media comprising computer-executable instructions operable to, when executed by at least one computer processor, enable the at least one computer processor to implement operations at a wireless station, the operations comprising processing a header field of a Physical Layer Convergence Protocol (PLCP) Protocol Data Unit (PPDU) received over a directional wireless communication band, the PPDU comprises a payload after the header field, the header field indicating presence of a control trailer after the payload, the control trailer comprising control information; and processing the control trailer.

Example 132 includes the subject matter of Example 131, and optionally, wherein the header comprises at least one bit to indicate that the control trailer is present after the payload.

Example 133 includes the subject matter of Example 132, and optionally, wherein the at least one bit comprises two bits.

Example 134 includes the subject matter of Example 132 or 133, and optionally, wherein the bit comprises a reserved bit.

Example 135 includes the subject matter of any one of Examples 131-134, and optionally, wherein the wireless station is a non-legacy station, the header field comprises a legacy PLCP header decodable by a legacy station, the control information comprises control information for the non-legacy station.

Example 136 includes the subject matter of any one of Examples 131-135, and optionally, wherein the header field comprises a length field indicating a length of the control trailer.

Example 137 includes the subject matter of Example 136, and optionally, wherein the length field comprises a Training (TRN) length field.

Example 138 includes the subject matter of Example 137, and optionally, wherein the header field comprises a packet type field comprising a value "1".

Example 139 includes the subject matter of any one of Examples 131-138, and optionally, wherein the control trailer comprises Low Density Parity Check (LDPC) codewords.

Example 140 includes the subject matter of any one of Examples 131-139, and optionally, wherein the control information comprises one or more Extended Directional Multi-Gigabit (EDMG) information elements.

Example 141 includes the subject matter of any one of Examples 131-140, and optionally, wherein the control information comprises channel bonding information of a bonded channel.

Example 142 includes the subject matter of any one of Examples 131-141, and optionally, wherein the control information comprises Multiple In Multiple Out (MIMO) information to configure a MIMO transmission.

Example 143 includes the subject matter of any one of Examples 131-142, and optionally, wherein the PPDU comprises a control frame.

Example 144 includes the subject matter of any one of Examples 131-143, and optionally, wherein the PPDU comprises a Request To Send (RTS) frame, or a Clear To Send (CTS) frame.

Example 145 includes the subject matter of any one of Examples 131-143, and optionally, wherein the PPDU comprises a Sector Sweep (SSW) frame, an SSW-feedback frame, or an SSW-Acknowledge (Ack) frame.

Example 146 includes the subject matter of any one of Examples 131-145, and optionally, wherein the wireless station is a Directional Multi-Gigabit (DMG) Station (STA).

Example 147 includes an apparatus of wireless communication by a wireless station, the apparatus comprising means for processing a header field of a Physical Layer Convergence Protocol (PLCP) Protocol Data Unit (PPDU) received over a directional wireless communication band, the PPDU comprises a payload after the header field, the header field indicating presence of a control trailer after the payload, the control trailer comprising control information; and means for processing the control trailer.

Example 148 includes the subject matter of Example 147, and optionally, wherein the header comprises at least one bit to indicate that the control trailer is present after the payload.

Example 149 includes the subject matter of Example 148, and optionally, wherein the at least one bit comprises two bits.

Example 150 includes the subject matter of Example 148 or 149, and optionally, wherein the bit comprises a reserved bit.

Example 151 includes the subject matter of any one of Examples 147-150, and optionally, wherein the wireless station is a non-legacy station, the header field comprises a legacy PLCP header decodable by a legacy station, the control information comprises control information for the non-legacy station.

Example 152 includes the subject matter of any one of Examples 147-151, and optionally, wherein the header field comprises a length field indicating a length of the control trailer.

Example 153 includes the subject matter of Example 152, and optionally, wherein the length field comprises a Training (TRN) length field.

Example 154 includes the subject matter of Example 153, and optionally, wherein the header field comprises a packet type field comprising a value "1".

Example 155 includes the subject matter of any one of Examples 147-154, and optionally, wherein the control trailer comprises Low Density Parity Check (LDPC) codewords.

Example 156 includes the subject matter of any one of Examples 147-155, and optionally, wherein the control information comprises one or more Extended Directional Multi-Gigabit (EDMG) information elements.

Example 157 includes the subject matter of any one of Examples 147-156, and optionally, wherein the control information comprises channel bonding information of a bonded channel.

Example 158 includes the subject matter of any one of Examples 147-157, and optionally, wherein the control information comprises Multiple In Multiple Out (MIMO) information to configure a MIMO transmission.

Example 159 includes the subject matter of any one of Examples 147-158, and optionally, wherein the PPDU comprises a control frame.

Example 160 includes the subject matter of any one of Examples 147-159, and optionally, wherein the PPDU comprises a Request To Send (RTS) frame, or a Clear To Send (CTS) frame.

Example 161 includes the subject matter of any one of Examples 147-159, and optionally, wherein the PPDU comprises a Sector Sweep (SSW) frame, an SSW-feedback frame, or an SSW-Acknowledge (Ack) frame.

Example 162 includes the subject matter of any one of Examples 147-161, and optionally, wherein the wireless station is a Directional Multi-Gigabit (DMG) Station (STA).

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising logic and circuitry configured to cause a wireless communication station to:
    set two bits in a header (L-Header) of a Physical Layer Protocol Data Unit (PPDU) to indicate presence of a control trailer;
    generate the control trailer by encoding control trailer information into a Low Density Parity Check (LDPC) codeword, the control trailer comprising 18 data bytes, the control trailer information comprising channel bandwidth (BW) information;
    include the control trailer in the PPDU after a payload of the PPDU; and
    transmit the PPDU in a frequency band above 45 Gigahertz (GHz).

2. The apparatus of claim 1 configured to cause the wireless communication station to set a Training Length field in the L-header to a value of "2".

3. The apparatus of claim 1 configured to cause the wireless communication station to set a Training Length field in the L-header to signal that the control trailer is to be in place of a Training (TRN) field after the payload.

4. The apparatus of claim 1 configured to cause the wireless communication station to modulate the control trailer according to a Directional Multi-Gigabit (DMG) control mode modulation scheme.

5. The apparatus of claim 1, wherein the control trailer information comprises Multiple-Input-Multiple-Output (MIMO) information.

6. The apparatus of claim 1, wherein the control trailer information comprises Multi-User (MU) Multiple-Input-Multiple-Output (MIMO) (MU-MIMO) information.

7. The apparatus of claim 1, wherein the control trailer information comprises information based on a type of the PPDU.

8. The apparatus of claim 1, wherein the PPDU comprises a control mode PPDU.

9. The apparatus of claim 1, wherein the PPDU comprises a Request to Send (RTS) or a Clear to Send (CTS).

10. The apparatus of claim 1, wherein the L-Header comprises a Directional Multi-Gigabit (DMG) header decodable by DMG stations.

11. The apparatus of claim 1, wherein the PPDU comprises a Directional Multi-Gigabit (DMG) PPDU.

12. The apparatus of claim 1 configured to cause the wireless communication station to transmit the PPDU over a channel bandwidth of at least 4.32 GHz.

13. The apparatus of claim 1, wherein the wireless communication station comprises an Extended Directional-Multi-Gigabit (EDMG) station (STA).

14. The apparatus of claim 1 comprising a Medium Access Control (MAC), and a Physical Layer (PHY).

15. The apparatus of claim 1 comprising a radio.

16. The apparatus of claim 1 comprising one or more antennas.

17. A product comprising one or more tangible computer-readable non-transitory storage media comprising computer-executable instructions operable to, when executed by at least one processor, enable the at least one processor to cause a wireless communication station to:
    set two bits in a header (L-Header) of a Physical Layer Protocol Data Unit (PPDU) to indicate presence of a control trailer;
    generate the control trailer by encoding control trailer information into a Low Density Parity Check (LDPC) codeword, the control trailer comprising 18 data bytes, the control trailer information comprising channel bandwidth (BW) information;
    include the control trailer in the PPDU after a payload of the PPDU; and
    transmit the PPDU in a frequency band above 45 Gigahertz (GHz).

18. The product of claim 17, wherein the instructions, when executed, cause the wireless communication station to set a Training Length field in the L-header to a value of "2".

19. The product of claim 17, wherein the instructions, when executed, cause the wireless communication station to set a Training Length field in the L-header to signal that the control trailer is to be in place of a Training (TRN) field after the payload.

20. The product of claim 17, wherein the instructions, when executed, cause the wireless communication station to modulate the control trailer according to a Directional Multi-Gigabit (DMG) control mode modulation scheme.

21. The product of claim 17, wherein the control trailer information comprises Multiple-Input-Multiple-Output (MIMO) information.

22. The product of claim 17, wherein the control trailer information comprises Multi-User (MU) Multiple-Input-Multiple-Output (MIMO) (MU-MIMO) information.

23. The product of claim 17, wherein the control trailer information comprises information based on a type of the PPDU.

24. The product of claim 17, wherein the PPDU comprises a control mode PPDU.

25. The product of claim 17, wherein the PPDU comprises a Request to Send (RTS) or a Clear to Send (CTS).

26. The product of claim 17, wherein the L-Header comprises a Directional Multi-Gigabit (DMG) header decodable by DMG stations.

27. The product of claim 17, wherein the PPDU comprises a Directional Multi-Gigabit (DMG) PPDU.

28. The product of claim 17, wherein the instructions, when executed, cause the wireless communication station to transmit the PPDU over a channel bandwidth of at least 4.32 GHz.

29. The product of claim 17, wherein the wireless communication station comprises an Extended Directional-Multi-Gigabit (EDMG) station (STA).

* * * * *